United States Patent
Taninaka et al.

(10) Patent No.: US 6,872,452 B2
(45) Date of Patent: Mar. 29, 2005

(54) DIELECTRIC FILM HAVING HIGH REFRACTIVE INDEX AND METHOD FOR PREPARATION THEREOF

(75) Inventors: Yasunori Taninaka, Osaka (JP); Katsuhisa Enjoji, Osaka (JP)

(73) Assignee: Nippon Sheet Glass Co., Ltd., Osaka (JP)

(*) Notice: Subject to any disclaimer, the term of this patent is extended or adjusted under 35 U.S.C. 154(b) by 0 days.

(21) Appl. No.: 10/298,071

(22) Filed: Nov. 15, 2002

(65) Prior Publication Data

US 2003/0170504 A1 Sep. 11, 2003

Related U.S. Application Data

(63) Continuation of application No. PCT/JP02/02000, filed on Mar. 5, 2002.

(30) Foreign Application Priority Data

Mar. 19, 2001 (JP) ........................................ 2001-078261

(51) Int. Cl.⁷ ................................................ B32B 9/00
(52) U.S. Cl. ...................... 428/432; 428/428; 428/433; 428/499; 428/701; 428/702; 204/192.1
(58) Field of Search ................................. 428/428, 432, 428/433, 689, 697, 699, 701, 702; 359/359, 580, 586, 588; 204/192.1

(56) References Cited

U.S. PATENT DOCUMENTS

| | | | | |
|---|---|---|---|---|
| 4,805,989 A | * | 2/1989 | Nakajima ................... 359/584 |
| 4,940,636 A | * | 7/1990 | Brock et al. ................ 428/426 |
| 5,399,252 A | | 3/1995 | Scherer et al. ......... 204/298.19 |
| 5,648,653 A | * | 7/1997 | Sakamoto et al. ....... 250/208.1 |
| 5,935,716 A | * | 8/1999 | McCurdy et al. ............ 428/428 |
| 6,115,180 A | | 9/2000 | Hirai et al. .................. 359/586 |

FOREIGN PATENT DOCUMENTS

| | | | |
|---|---|---|---|
| EP | 0 305 135 | * | 3/1989 |
| JP | 59-102201 | * | 6/1984 |
| JP | 59-184744 | * | 10/1984 |
| JP | 03-187733 | | 8/1991 |
| JP | 05-148644 | | 6/1993 |
| JP | 07-233469 | | 9/1995 |
| JP | 08-283935 | | 10/1996 |
| JP | 10-332931 | | 12/1998 |

OTHER PUBLICATIONS

International Search Report: Form PCT/ISA210 4 sheets.

* cited by examiner

Primary Examiner—Deborah Jones
Assistant Examiner—G. Blackwell-Rudasill
(74) Attorney, Agent, or Firm—David G. Conlin; George W. Neuner; Edwards & Angell LLP

(57) ABSTRACT

The high refractive dielectric film which can be used stably as a constituent material of an optical multi-layer film, namely, and which does not cause change over time in optical properties and has small film stress, is an amorphous material having no columnar structure, obtained by adding to a main component titanium oxide (TiOx: $1 \leq x \leq 2$) another metal oxide (MOw: M represents a metal such as niobium, tantalum, $1 \leq w$). Though titanium oxide is a material which tends to manifest a crystalline structure even in the form of a thin film, a mixed high refractive dielectric film can be obtained, containing titanium oxide causing little change over time in optical properties by rendering the resulting thin film amorphous by inhibiting growth of a crystal of titanium oxide by adding another metal oxide.

6 Claims, 9 Drawing Sheets

(a)

(b)

(c)

(d)

(a)

(b)

(c)

(d)

(a)

(b)

(c)

(d)

(a)

(b)

(a)

(b)

DIELECTRIC FILM HAVING HIGH REFRACTIVE INDEX AND METHOD FOR PREPARATION THEREOF

RELATED APPLICATIONS

This application is a continuation of International Application PCT/JP02/02000 filed Mar. 5, 2002, which designates the United States, and which claims priority to Japanese Patent Application 2001-78261, filed Mar. 19, 2001.

TECHNICAL FIELD

The present invention relates to a high refractive dielectric film constructing an optical multi-layer film interference filter suitable for optical elements frequently used in the optical communications field, and a method for producing the same.

BACKGROUND ART

In the field of optically applying a dielectric film, anti-reflection films and infrared reflection films used in the form of a single layer film, and further, anti-reflection films, reflection-increasing films and semi-permeable films allowing specific wavelengths to be reflected or permeate selectively, designed in the form of a multi-layer film of approximately 10 layers, and the like are used.

Recently, with enlargement and development of industries in the optical communications field, optical filters capable of precisely selecting a specific wavelength are desired. For example, among optical filters used in demultiplexer and multiplexer which are essential parts as a module for optical communications of a wavelength multiplex mode are a narrow band filter and edge filter, and dielectric multi-layer films realizing these are generally constructed of a multi-layer film containing from tens to several hundreds or more layers, and the spectral property thereof is optically designed using the refractive index (n) and film thickness of each layer as parameters.

The above-mentioned optical multi-layer film is manufactured by alternately laminating a transparent thin film having a relatively high refractive index and a transparent thin film having a relatively low refractive index. When the difference in refractive index of two kinds of materials laminated alternately is large, design of an optical multi-layer film is more advantageous, since a desired optical property can be realized with a smaller number of layers.

In general, as for the range of a high refractive index of the above-mentioned optical multi-layer film, a range from 1.9 to 2.5 is exemplified, and as a range of a low refractive index thereof, a range from 1.3 to 1.6 is exemplified, conventionally. As the transparent material of a high refractive index, titanium oxide (n≈2.4: n represents refractive index), zinc sulfide (n≈2.3), zirconium oxide (n≈2.2), niobium oxide (n≈2.2), tantalum oxide (n≈2.1), cerium oxide (n≈2.2)m hafnium oxide (n≈2.2), neodymium oxide (n≈2.1), tungsten oxide (n≈2.0), tin oxide (n≈2.0), tin-doped indium oxide (n≈1.9), yttrium oxide (n≈1.9) and the like are known. AS the transparent material of a low refractive index, silicon oxide (n≈1.46), magnesium fluoride (n≈1.38) and the like are known.

The refractive index has wavelength dependency, and the above-mentioned refractive index is a value in the near infrared wavelength range.

An optical multi-layer film using these transparent materials is formed on a substrate by vacuum film-forming methods such as a vacuum evaporation method, sputtering method and the like. Thin film-forming methods are appropriately selected depending on use, necessary properties, productivity and the like.

In the cases of effecting film-forming over a wide range area with uniform thickness, of effecting film-forming at a relatively low temperature, and of raising close adherence with a substrate, a sputtering method is advantageous.

As the high refractive dielectric material, titanium oxide having a high refractive index and easily available from the standpoint of cost is widely used among the above-exemplified compounds. However, it is known that a thin film of titanium oxide generally has the following problems.

(1) Variation in thin film formation conditions (for example, degree of vacuum, oxygen partial pressure and the like in an evaporation method) tends to change the refractive index of the titanium oxide obtained, and reproducibility of the properties of an optical multi-layer film is difficult to obtain. The reason for this is that even if the degree x of oxidation of TiOx varies, stoichiometrically stable $TiO_2$ is not necessarily obtained. As a result, an optical multi-layer film having a designed optical property may not be obtained in some cases.

(2) A film-forming speed in forming a dielectric film by a sputtering method is extremely slow. A radio frequency (RF) sputtering method has been recently used as a general technology for a target material having small electrical conductivity and film-forming speed has been improved, however, the RF sputtering method is still in an industrially disadvantageous condition.

(3) The optical properties of a titanium oxide thin film, particularly, refractive index change over time during storage in air. Therefore, in the case of an optical filter using titanium oxide as a high refractive material, there occurs a problem in that the wavelength to be selectively allowed to permeate and be reflected shifts from its given position.

(4) Film stress is as relatively large as about 1 GPa (compression). On the other hand, the film stress of silicon oxide widely used as a low refractive material is about 0.2 GPa (compression), and this difference produces problems in cracking of a film and peeling of a film at the interface of a multi-layer film.

The problems of the above-mentioned (1) has been attempted to be solved by designs of equipment and operation such as improvement in an apparatus of controlling an atmospheric gas introduced into a vacuum layer, improvement of operation conditions, selection of raw materials, and the like. However, these are only intrinsic improvements in facilities and methods, and not accepted as technologies capable of solving the above-mentioned problem.

Regarding the problem in the above-mentioned (2), Japanese Unexamined Patent No. Hei-7-233469 discloses, for example, that film-forming speed can be improved by a DC sputtering method in which an oxide sintered body target of TiOx is allowed to have electrical conductivity. Also, addition of other oxides for increasing film-forming speed is disclosed. Further, Japanese Unexamined Patent No. Hei-8-283935 discloses that film-forming speed can be improved by using a target having a smaller degree of oxidation than that of the stoichiometrical composition and minimizing an oxygen gas introduced.

However, these technologies are only related to film-forming speed. Additionally, since an oxide or suboxide target is used, there is another problem in that coincidence of the composition of a target and the composition of the resulting oxide thin film is difficult.

Regarding the problems of (3) and (4), instead of titanium oxide having a high refractive index, there have been no solution means for performing sufficient effects found yet.

At this conventional technological level, there are actually often used niobium oxide and tantalum oxide having a refractive index somewhat lower than that of titanium oxide, as a high refractive material in an optical multi-layer film. In this case, an optical design for obtaining necessary optical properties is difficult since the refractive index is smaller than that of titanium oxide.

In optical elements required to manifest desired properties only in an extremely precisely restricted wavelength range, such as an optical filter used in demultiplexer and multiplexer which are essential parts as a module for optical communications of a wavelength multiplex mode, the fact that the above-mentioned problems have not been solved is an extremely important problem industrially.

DISCLOSURE OF INVENTION

An object of the present invention is to provide the above-mentioned high refractive dielectric film which can be used stably as a constituent material of an optical multi-layer film, namely, which does not cause a change over time in optical properties and has small film stress.

The high refractive dielectric film of the present invention is characterized in that it is made of an amorphous material having no columnar structure, obtained by adding to titanium oxide (TiOx: $1 \leq x \leq 2$) another metal oxide (MOw: M represents a metal, $1 \leq w$).

Titanium oxide is a material which tends to have a crystal structure even if the thickness of a film is thin, and as described in reports investigating and studying the structure of a thin film of titanium oxide, the crystal thereof tends to have a columnar structure grown in the form of columns (FIG. 4($a$)), and a space in which water molecules and gas molecules are adsorbed and desorbed is present at the crystal grain boundary.

The present inventors have recognized the crystal structure in the form of columns of titanium oxide and inferred that the above-mentioned changes in optical properties over time of a titanium oxide thin film are mainly based on water molecules and gas molecules adsorbed and desorbed at the crystal grain boundary, and succeeded in inhibiting growth of a crystal of titanium oxide by adding other metal oxides and obtaining a titanium oxide causing little change in optical properties over time by making the obtained film amorphous.

Namely, since the high refractive dielectric film of the present invention is amorphous and accordingly has no crystal grain boundary, water molecules and gas molecules are not adsorbed and desorbed at the crystal grain boundary, and resultantly, changes over time in optical properties based on water molecules and gas molecules can be suppressed.

Even in an amorphous thin film, there may occur three embodiments, a porous columnar structure (FIG. 4($b$)), a complete amorphous structure (FIG. 4($c$)), or an aggregated structure of amorphous fine particles (FIG. 4($d$)). Because of the above-mentioned reason, it is preferable that the amorphous thin film of the present invention has a complete amorphous structure or an aggregated structure of amorphous fine particles.

Since the high refractive dielectric film of the present invention is amorphous, a thin film having a smooth surface is obtained. Namely, when a high refractive film and a low refractive film are laminated alternately on a substrate, the interface thereof is smooth, therefore, scattering of light at the interface does not occur easily, and scattering loss of incident light on an optical filter can be decreased. Particularly, in the case of a multi-layer film of as much as one hundred layers, this effect is extremely remarkable. Here, as described above, a high refractive index means a refractive index in the range from about 1.9 to 2.5, and a low refractive index means a refractive index in the range from about 1.3 to 1.6.

The high refractive dielectric film of the present invention is characterized in that the ratio of the other metal component to the total amount of titanium and the other metal components (M/(Ti+M)) is 30 atom % or more.

When the ratio of the above-mentioned other metal component is less than 30 atom %, a columnar crystal structure is formed in the main component titanium oxide, and the amorphous structure which is characteristic in the present invention is not obtained. When the ratio of the metal component increases, an action by the other metal component to inhibit growth of a crystal of titanium oxide increases, and when the above-mentioned ratio is 30 atom % or more, a dielectric film made of a mixture of titanium oxide and other metal oxides can be amorphous.

To make the above-mentioned dielectric film amorphous, the ratio of the other metal component may advantageously be 30 atom % or more, and the upper limit is not particularly defined. Even if the ratio of the other metal component is 30 atom % or more, when the thickness of a high refractive dielectric film is at most about 320 nm as in the case of use in an optical multi-layer film, the metal oxide itself does not manifest growth of a crystal, or growth of a crystal of titanium oxide is not advanced, maintaining an amorphous structure which is characteristic in the present invention.

In this case, however, the composition ratio of the other metal component increases over 30 atom % and the refractive index decreases sequentially, from the refractive index of titanium oxide (about 2.4) to the refractive index of the other metal component itself.

Even a high refractive material having a lower refractive index than that of titanium oxide, can be used if the composition ratio of the other metal component is appropriately selected in a range of 30 atom % or more, so that the refractive index in a range capable of designing an optical multi-layer film is obtained.

The refractive index of a high refractive material of a dielectric multi-layer film is desirably 2.25 or more. Such a reflective index can be maintained, where the composition ratio is 80 atom % or less when the other metal component is niobium and the composition ratio is 60 atom % or less when the other metal component is tantalum, to maintain this refractive index of 2.25 or more.

As the above-mentioned other metal component used in the high refractive dielectric film of the present invention, niobium oxide (NbOy: $1 \leq y \leq 5/2$), tantalum oxide (TaOy: $1 \leq y \leq 5/2$) and the like are listed.

Niobium oxide and tantalum oxide are, as described above, materials which can also be used alone as a high refractive material constructing an optical multi-layer film. Even in the form of a thin film, when mixed with titanium oxide tending to have a crystal structure, there occurs an action to inhibit growth of a crystal of titanium oxide. Further, niobium oxide and tantalum oxide do not crystallize easily themselves in a thin film condition, and the compounding ratio with titanium oxide can be selected freely.

The above-mentioned other metal oxide for obtaining a high refractive dielectric film which is an amorphous material having no columnar structure of the present invention is required to have a high refractive index, to inhibit growth of a crystal of titanium oxide and to make it difficult for the material itself to become a thin film crystal.

As such metal oxides, neodymium oxide (NdOi: 1≦i≦5/2), cerium oxide (CeOj: 1≦j≦2), zirconium oxide (ZrOk: 1≦k≦2) and hafnium oxide (HfOm: 1≦m≦2) and the like are listed, in addition to said niobium oxide and tantalum oxide.

The above-mentioned various metal oxides preferably have a stoichiometric composition (for example, in the case of niobium oxide, Nb2O5) since the reproducibility of the properties of an optical element produced is secured easily, however, there is necessarily no limitation to the stoichiometric composition.

The high refractive dielectric film of the present invention desirably has a film stress of 0.30 GPa or less.

The above-mentioned film stress occurs by deficiency of an atom to be positioned naturally in a given site in a crystal lattice (for example, in the case of oxides, presence of oxygen deficiency), incorporation of an atom other than atoms to be present into a lattice (for example, presence of Argon in a sputtering gas), and strain of a crystal lattice with an isotropy.

Though compression stress is different depending on the method for producing a high refractive dielectric film of the present invention, a compression stress of about 1 GPa is generated in a titanium oxide thin film. The compression stress of a silicon oxide film and magnesium fluoride film often used as a low refractive material in an optical multi-layer film is about 0.2 GPa.

When a thin film of titanium oxide and a thin film of silicon oxide are laminated alternately, a tensile force is acted on a thin film of silicon oxide due to a difference in film stress, and there may occur cracks in the silicon oxide film and further, peeling at the interface of the film. In actuality, this causes a deterioration in reliability when used as an optical element.

Since the high refractive dielectric film of the present invention is produced so that it becomes amorphous, the above-mentioned strain in a crystal lattice is not present, and even if there is deficiency or excess of atoms in an amorphous thin film, the influence of this is limited locally, therefore, film stress can be decreased extremely. When the film stress is 0.3 GPa or less, even if a high refractive dielectric film of an optical multi-layer film is laminated with, for example, a low refractive dielectric film of silicon oxide, there is no generation of cracks in a thin film and peeling at the interface of a thin film.

The film stress of the high refractive dielectric film of the present invention is sufficiently 0.3 GPa or less (compression), and though there is no necessity of consideration on the lower limit thereof, the lower limit is preferably from 0.1 to 0 GPa (compression).

Since a low refractive material often used has compression stress in general, there is no problem if a high refractive material is allowed to generate a tensile film stress of about 0 to 0.3GPa, to relax the stress of the whole optical multi-layer film.

The high refractive dielectric film of the present invention can be produced by a reactive neutralization sputtering method in which alternating voltage is applied to a pair of cathodes so as to change polarities alternately and oxygen is used as a reactive gas.

Since the above-mentioned sputtering method has a characteristic in that a non-electrical conductive thin film in particular can be formed without causing variation in properties over a long period of time, a high refractive dielectric film having optical properties as precisely designed can be formed.

BEST MODE FOR CARRYING OUT THE INVENTION

Embodiments of the present invention will be explained together with the drawings.

Figure 1:
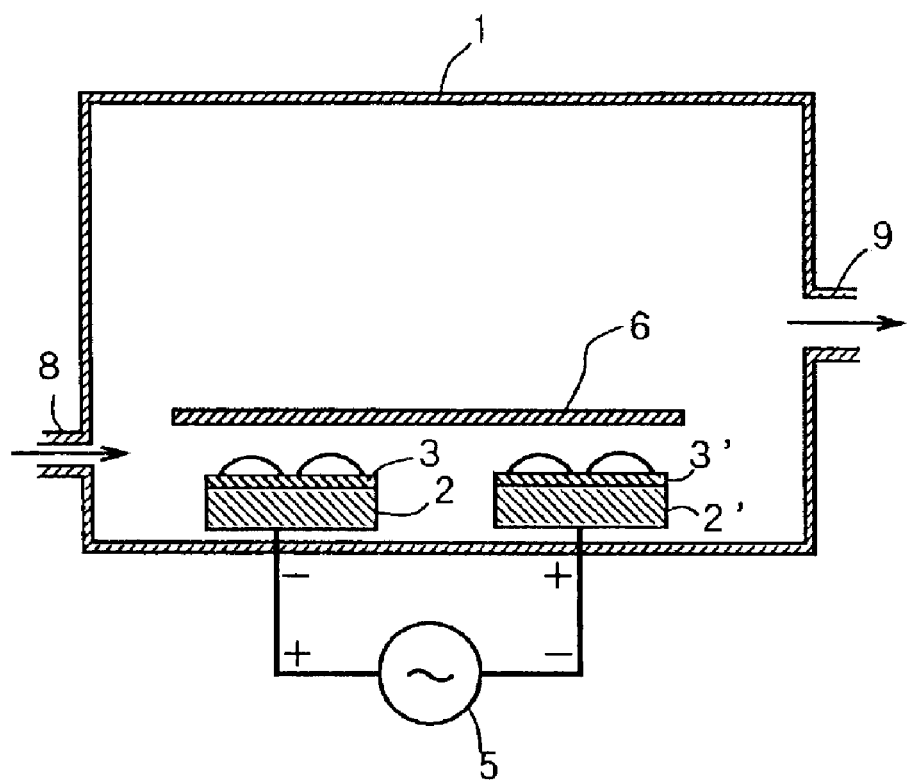
FIG. 1 is a schematic view of a sputtering apparatus used advantageously to form a high refractive dielectric film of the present invention.

FIG. 1 is a schematic view of a sputtering apparatus used advantageously to form a high refractive dielectric film of the present invention.

A pair of cathodes 2, 2' are placed adjacently in parallel in a vacuum chamber 1, and targets 3, 3' made of the same compositions are mounted on the cathodes 2, 2', respectively.

Alternating voltage is applied from an alternating current source 5 to the pair of cathodes 2, 2' so as to mutually change the polarities thereof alternately. Namely, when a plus voltage is applied to the cathode 2, a minus voltage is applied to the other cathode 2', while, when a minus voltage is applied to the cathode 2, a plus voltage is applied to the other cathode 2'. Here, cathode does not mean "negative electrode" literally but means "part of supplying power force to the target".

Further, a substrate 6 (in this example, a glass plate is used) on which surface a high refractive dielectric film is formed is placed at a location opposite to the targets 3, 3' in the vacuum chamber 1.

When a high refractive dielectric film made of TiOx and NbOy is produced in the present invention, an alloy made of titanium (Ti) and niobium (Nb) in a given compounding ratio or a mixture of these metals is used as the material of the targets 3, 3'. A mixed gas of argon (Ar) and oxygen ($O_2$) is used as a process gas. The above-mentioned process gas is introduced through a gas introduction port 8 and discharged from a discharge port 9.

Namely, for forming the high refractive dielectric film of the present invention, a mixed dielectric film composed of TiOx and NbOy mixed is formed on the surface of a substrate 6 by sputtering the metal targets 3, 3' with plasma generated by alternating voltage while causing a reaction with oxygen of process gasses, according to a so-called reactive neutralization sputtering method.

In the present invention, it is preferable to select a gas partial pressure called reactive mode in which the ratio of $O_2$ is increased against the total amount of process gasses (Ar+$O_2$), of reactive sputtering methods. The reason for this is that in film formation by the reactive mode, a thin film to be formed is an oxide, therefore, the composition of an oxide thin film tends to have a stoichiometric composition in the reactive mode, and resultantly, the optical properties of the oxide thin film are obtained with good reproducibility.

Further, it has been confirmed by experiments of the inventors that in an oxide thin film formed by a reactive mode in which the ratio of $O_2$ is high, the metal composition of the target and the metal composition in the thin film coincides almost completely.

For example, when alloy targets 3, 3' made of Ti and Nb in which the ratios of Nb (Nb/(Ti+Nb)) are 30.0 atom % and 40.0 atom % are used, the ratios of Nb in the resulting oxide thin film are 29.5 atom % and 39.8 atom %, respectively. Since the composition of a thin film exerts a direct influence on optical properties in the technologies of producing an optical multi-layer film, it is a great merit to be able to obtain the intended composition by controlling the composition of a thin film. This means that components in the targets 3, 3' have reacted with necessary and sufficient oxygen to give an oxide thin film having a composition near the stoichiometric composition.

Further, the reactive mode is advantageous for production of an optical multi-layer film in which a significant amount of thin films are laminated while precisely controlling the film thickness of each thin film because of a feature of stabilization of the film-forming speed, though the reactive mode has a demerit in relatively slow film-forming speed.

Furthermore, an oxide thin film formed by the reactive mode in which the ratio of $O_2$ is high manifests decreased oxygen deficiency inside, therefore, absorption of laser light used in optical communications, for example having a wavelength of 1550 nm lowers, and resultantly, a merit occurs in that permeation loss of a light signal can be decreased.

Among reactive sputtering methods, in a so-called metal mode in which the ratio of $O_2$ is reduced against the total amount of process gases (Ar+$O_2$), the film-forming speed is relatively fast, however, the degree of oxidation of the resulting oxide thin film is not stabilized easily, resultantly, the reproducibility of the optical properties of the oxide thin film tends to deteriorate. Additionally, it is difficult to obtain an effect of use of the above-mentioned reactive mode by the metal mode, in producing an optical multi-layer film.

A sputtering method in which an oxide sintered body having the same composition as that of a film to be formed is used as the material of targets 3, 3' is also a general means, against the reactive sputtering with oxygen using the metal targets 3, 3', however, the composition of an oxide thin film obtained by this means often does not necessarily coincide with the composition of the targets 3, 3', and it is difficult to allow the optical properties of a thin film to be manifested as designed.

Next, the neutralization sputtering for forming the high refractive dielectric thin film of the present invention will be illustrated.

In the case of use of metal targets 3, 3' and inclusion of no oxygen in process gases, namely, when a metal film is formed, the targets 3, 3' have electrical conductivity, therefore, electric charge from plasma is not charged on the targets 3, 3' even if DC (direct current) sputtering is conducted. In the present invention, reactive sputtering with $O_2$ is conducted using metal targets 3, 3', therefore, in particular, a non-erosion part on the surface of the metal targets 3, 3' is oxidized to become non-electrical conductive, consequently, when DC sputtering is effected, an electric charge from plasma is charged on the targets 3, 3' and arcing due to insulation breakage occurs.

In the neutralization sputtering, alternating voltage is applied to a pair of cathodes 2, 2' placed adjacently so that the polarities thereof change alternately and respective cathodes 2 and 2' perform roles of a cathode (negative electrode) and an anode (positive electrode) alternately, consequently, the surface of the targets 3, 3' is always maintained at a constant condition and a stable discharging condition is kept. Namely, since an electric charge charged to an oxide (non-electrical conductive substance) accumulated on a non-erosion part of the targets 3, 3' is neutralized in each cycle of alternating current (AC), arcing as generated in DC sputtering does not occur.

Resultantly, the composition of an oxide thin film formed during a process of laminating a multi-layer film over a long period of time can be maintained constant, and a high refractive dielectric film in which the refractive index and film thickness are controlled precisely can be obtained.

The period of alternating voltage applied is preferably 100 Hz or more, further preferably 1 kHz or more. In the case of less than 100 Hz, neutralization of electric charge in each alternating cycle delays and sufficient electricity removal cannot be carried out.

The period of alternating voltage is preferably 1 MHz or less, further preferably 100 kHz or less. When over 1 MHz, an ion from targets 3, 3' to plasma does not shift, following a change in polarity, and sufficient sputtering cannot be conducted, leading to an extremely small film-forming speed.

The target material in the case of conducting neutralization sputtering may be an electrical conductive material such as metal and the like or a non-electrical conductive material such as oxides and the like.

In the case of formation of a dielectric multi-layer film on a substrate 6, a high refractive dielectric film and a low refractive dielectric film are laminated alternately, therefore, the other pair of targets not shown in FIG. 1, and the other process gas introduction port and apparatus of carrying the substrate 6 are placed in a vacuum apparatus.

First, a high refractive thin film is formed on the substrate 6 by the above-mentioned reactive neutralization sputtering using a pair of targets 3, 3' under given sputtering conditions (kind of process gas, pressure, electric power and the like).

Then, the substrate 6 is transferred to a location opposite to the other pair of targets (not shown), the other given sputtering conditions are made in the vacuum chamber 1, and a low refractive thin film is formed by the reactive neutralization sputtering using the other pair of targets.

This process is repeated a given number of times corresponding to the number of laminations according to the design of an optical multi-layer film, to form a dielectric multi-layer film.

The thin film formed first on the substrate 6 may be a low refractive dielectric film without problems.

EXAMPLE 1

A mixed dielectric body of TiOx and NbOy was used as a high refractive dielectric film (hereinafter, H), SiOz was used as a low refractive dielectric material (hereinafter, L), and an edge filter in which these are laminated alternately was produced, a weather resistance test against high temperature and high humidity was carried out on the resulting edge filter, and change in optical property before and after the test (wavelength shift amount) was evaluated.

Five kinds of edge filters were produced for obtaining a relation between the composition ratio of NbOy in the TiOx-NbOy mixed dielectric body and the weather resistance of the resulting edge filter.

As the pair of targets 3, 3' for forming H, a Ti—Nb alloy was used, and as the other pair of targets (not illustrated) for forming L, a Si metal was used.

Five kinds of Ti—Nb alloy targets were prepared, and the composition ratios of Nb in the alloys were 0%, 10%, 20%, 30% and 40% represented by atomic %.

Only one kind of Si metal was used as the target for forming L, for five-kinds of targets for forming five kinds of H.

A mixed gas of argon (Ar) and oxygen ($O_2$) was used as a process gas. Regarding the amounts, Ar was 25 $cm^3$/min and $O_2$ was 40 $cm^3$/min when H was formed, and Ar was 15 $cm^3$/min and $O_2$ was 50 $cm^3$/min when L was formed.

The sputtering voltage was 7 kW when H was formed and 8 kW when L was formed.

The pressure in sputtering was 1.20 Pa (9 mTorr) when H was formed and 0.93 Pa (7 mTorr) when L was formed.

The frequency of the alternating current applied to the pair of targets was 40 kHz.

Optical glass (BK7, boro-silicate glass from Shott AKG in Germany) having a diameter of 30 mm and a thickness of 1 mm was washed by an ultrasonic washing machine using an alkaline detergent, and directly, mounted in a vacuum chamber which is the above-mentioned reactive neutralization sputtering apparatus.

Film thickness control of each layer of H and L was conducted by a direct visual type optical monitor so as to give the desired (as designed) film thickness, in the monitor, the permeability of the substrate 6 attached to the vacuum chamber 1 being able to be directly measured also during film formation.

A dielectric multi-layer film composed of 61 layers was laminated on the substrate 6 made of BK7 (boro-silicate glass from Shott AKG in Germany) according to the above-mentioned procedures for laminating H and L alternately using the above-mentioned sputtering conditions.

In this example, the film constituents of a dielectric multi-layer film (designed values) were controlled as described below.

Glass substrate/1.012L/0.883H/0.823L/0.944H/1.076L/1.112H/0.713L/(1.0H/1.0L)23/1.0H/0.728L/1.113H/1.081L/0.910H/0.763L/0.745H/0.700L A numerical value before H or L means magnification against the base thickness of each layer. The base length is (wavelength ($\lambda$)/4)/refractive index, ($\lambda$=1300 nm)).

The above-described (1.0H/1.0L) 23 means that H and L each having a base thickness were used as a pair and 23 layers of this pair were laminated.

Layers before and after the above-described (1.0H/1.0L) 23 were layers formed to suppress ripples (spectrum in the form of ripple) in the permeable range.

By the above-mentioned procedures, five kinds of edge filters having mutually different compositions of Nb in a high refractive dielectric film were obtained.

Next, a weather resistance test against high temperature and high humidity by a pressure cooker test (PCT) was carried out on these five kinds of edge filters, and change in optical property before and after the test (wavelength shift amount) was evaluated.

PCT is a method for advancing and evaluating weather resistance of various materials and parts against high temperature and high humidity, and a general method in which the real time of a test is shortened and advanced. In this example, the test conditions included 150° C., 90% RH, 150 kPa (1.5 atmospheric pressure: absolute pressure), and 10 hours.

Figure 2:
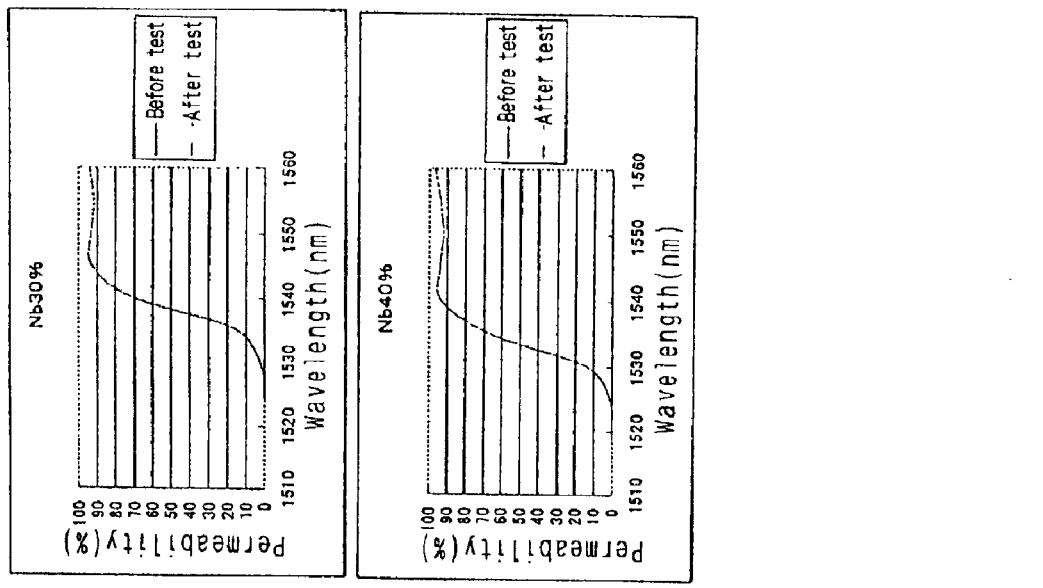
FIG. 2 shows wavelength shifts (Δλ) before and after PCT of five kinds of edge filters of a dielectric film made of a mixture of titanium oxide and niobium oxide.
Figure 2:
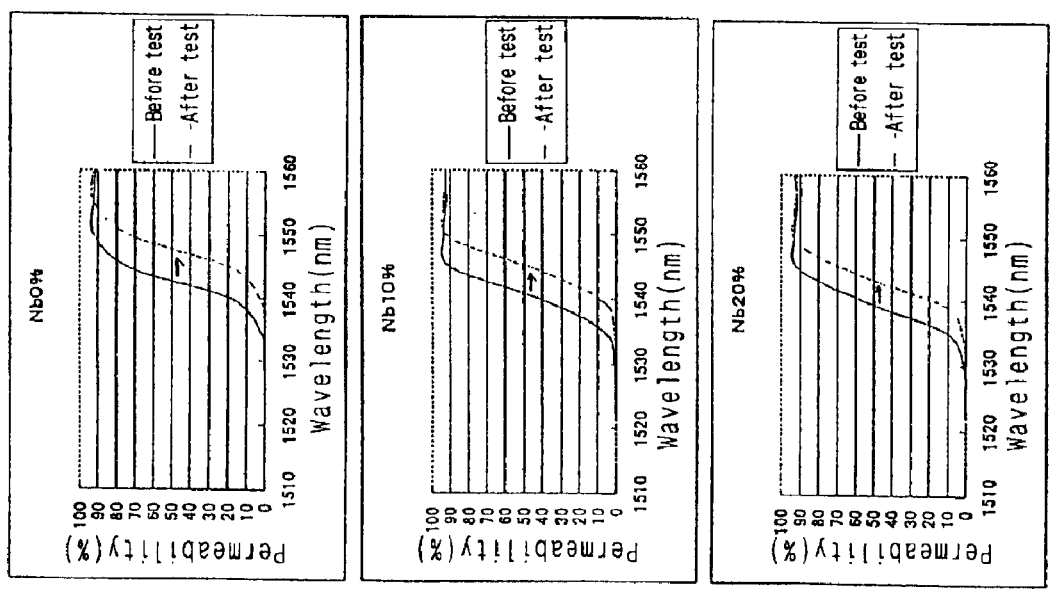

On the five kinds of edge filters, wavelength shifts ($\Delta\lambda$) before and after PCT are shown in FIG. 2. The permeability spectrum was measured by an optical spectrum analyzer using an LED light source.

TABLE 1

|  | TiOx-NbOy | Refractive index | SiOw refractive index | $\Delta\lambda$ |
|---|---|---|---|---|
| Nb compositon ratio (atom %) | 0 | 2.400 | 1.460 | 5.0 nm |
|  | 10 | 2.390 | 1.460 | 4.5 |
|  | 20 | 2.385 | 1.460 | 4.0 |
|  | 30 | 2.380 | 1.460 | 0.2 |
|  | 40 | 2.360 | 1.460 | 0.1 |

It is known from FIG. 2 and Table 1 that when the Nb composition ratio in a high refractive dielectric film was over 30 atom %, the wavelength shift before and after PCT was 0.2 or less, in the five kinds of edge filters.

This result corresponds to that when the Nb composition ratio was over 30 atom %, the structure of a thin film changed from crystal to amorphism, in FIG. 5 described below.

Namely, it was confirmed that when the ratio of NbOy in TiOx was increased, the structure of a thin film was changed, and resultantly, a multi-layer film excellent in weather resistance is obtained.

Even in a high refractive dielectric film having the atomic ratio of Nb of 40%, the refractive index thereof is larger by about 2.20 of the refractive index than that of NbOy 100% (single composition). Namely, it was shown that problems of titanium oxide in weather resistance against water and the like were solved and properties as a high refractive dielectric film were maintained.

EXAMPLE 2

A mixed dielectric body of TiOx and TaOy was used as a high refractive dielectric film (hereinafter, H), SiOz was used as a low refractive dielectric film (hereinafter, L), and an edge filter in which these were laminated alternately was produced, a weather resistance test against high temperature and high humidity was carried out on the resulting edge filter, and change in optical property before and after the test (wavelength shift amount) was evaluated.

Five kinds of edge filters were produced for obtaining a relation between the composition ratio of TaOy in the TiOx-TaOy mixed dielectric body and the weather resistance of the resulting edge filter.

Namely, five kinds of edge filters were produced in the same manner as in Example 1 except that the Ti—Ta alloy target was used instead of the Ti—Nb alloy target used in Example 1, and the wavelength shift before and after PCT was measured for each sample.

However, in this example, the film constituents of a dielectric multi-layer film (designed values) were controlled as described below.

Figure 3:
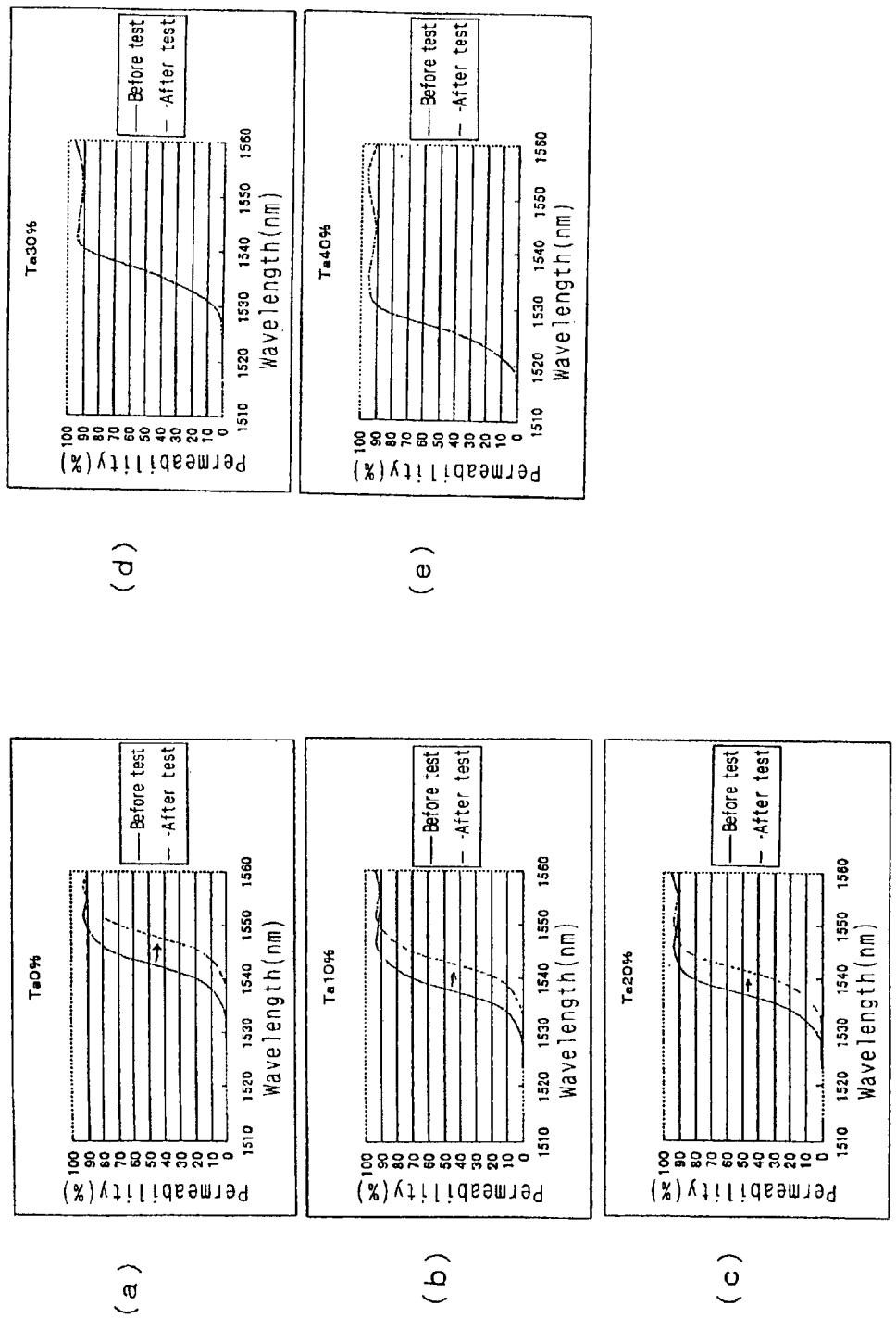
FIG. 3 shows wavelength shifts (Δλ) before and after PCT of five kinds of edge filters of a dielectric film made of a mixture of titanium oxide and tantalum oxide.
Figure 4:
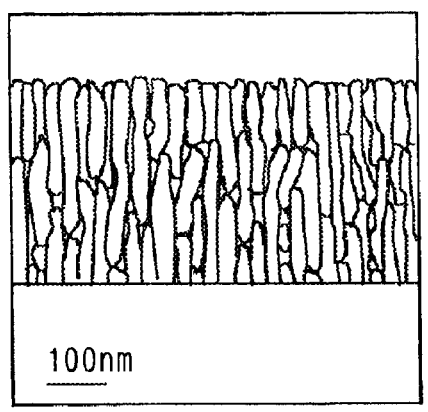
FIG. 4 shows a crystalline columnar structure of titanium oxide (FIG. 4(a)), an amorphous porous columnar structure (FIG. 4(b)), a complete amorphous structure (FIG. 4(c)), and an aggregated structure of amorphous fine particles (FIG. 4(d)).
Figure 4:
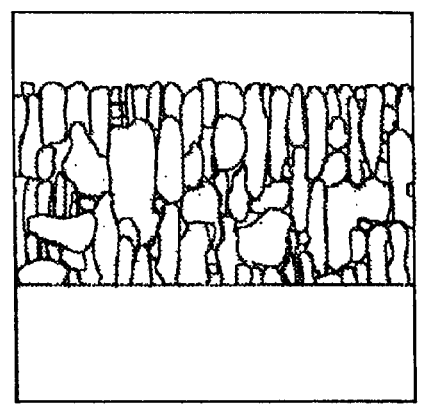
Figure 4:
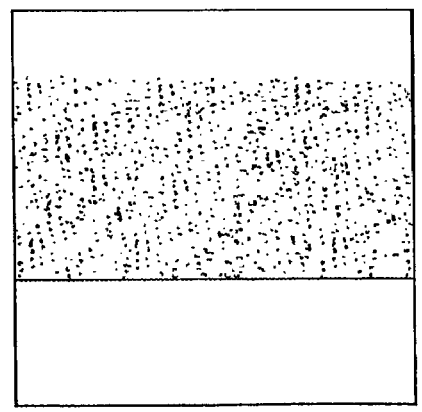
Figure 4:
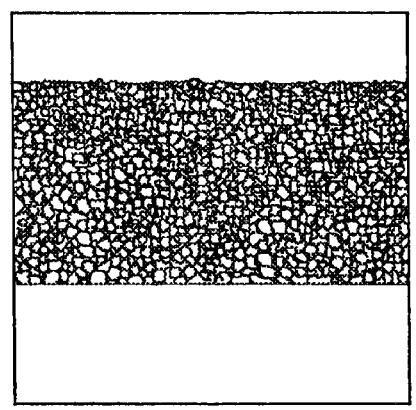

Glass substrate/0.930L/0.879H/0.835L/0.944H/1.088L/1.111H/0.703L/(1.0H/1.0L)23/1.0H/0.709L/1.123H/1.093L/0.946H/0.758L/0.689H/0.651L The results are shown in FIG. 3 and Table 2.

TABLE 2

|  | TiOx-TaOy | Refractive index | SiOw refractive index | Δλ |
|---|---|---|---|---|
| Ta composition ratio (atom %) | 0 | 2.400 | 1.460 | 5.5 nm |
|  | 10 | 2.380 | 1.460 | 5.0 |
|  | 20 | 2.375 | 1.460 | 4.5 |
|  | 30 | 2.370 | 1.460 | 0.2 |
|  | 40 | 2.330 | 1.460 | 0.1 |

It is known from FIG. 3 and Table 2 that when the Ta composition ratio in a high refractive dielectric film was over 30 atom %, the wavelength shift before and after PCT was 0.2 or less, in the five kinds of edge filters.

This result corresponds to that when the Ta composition ratio was over 30 atom %, the structure of a thin film changed from crystal to amorphism, as in FIG. 6 described below.

Namely, it was confirmed that when the ratio of TaOy in TiOx was increased, the structure of a thin film was changed, and resultantly, a multi-layer film excellent in weather resistance was obtained.

It could be confirmed that a thin film containing TaOy in TiOx, as a high refractive material constructing a dielectric multi-layer film used in an optical filter, can solve the problem of TiOx on weather resistance, and further, maintain high refractive index.

EXAMPLE 3

Six kinds of samples in which the composition of the other metal components was mutually different were prepared, to check the relation between the composition ratio of the other metal component and ① crystallinity of dielectric film, ② refractive index of dielectric film and ③ film stress of dielectric film, in a high refractive dielectric film made of a mixture of titanium oxide and the other metal oxide.

Niobium oxide and tantalum oxide were used as the other metal oxide.

Six kinds of alloy targets were prepared in which the composition ratio (atom %) of Nb in a Ti—Nb alloy target was controlled to 0%, 10%, 20%, 30%, 40% and 80% so that the composition ratio (atom %) of niobium based on the total amount of metal components in a high refractive dielectric film were 0%, 10%, 20%, 30%, 40% and 80%, respectively.

Also regarding the Ti—Ta alloy target, six kinds of alloy targets were prepared in which the composition ratio (atom %) of Ta in a Ti—Ta alloy target was controlled to 0%, 10%, 20%, 30%, 40% and 80%.

The targets in which the composition ratios of Nb and Ta are 0%, 10%, 20%, 30%, 40% were the same as used in Examples 1 and 2.

A pair of targets 3, 3' made of a Ti—Nb alloy in which the composition ratio (atom %) of Nb was 0% were mounted to cathodes 2, 2', and two quartz glasses of a thickness 1.5 mm and a diameter 30 mm and one quartz glass of a thickness 0.25 mm and a diameter 30 mm were mounted to a vacuum chamber 1 in parallel as substrates 6.

Thereafter, three samples were obtained on which the high refractive dielectric film of a single layer structure made of $TiO_2$ having a thickness of 250 nm was formed, by reactive neutralization sputtering under the same conditions as used for formation of a high refractive dielectric film on the substrate 6 in Example 1.

Next, three samples were obtained on which a high refractive dielectric film of a single layer structure having a thickness of 250 nm made of a mixture of titanium oxide and niobium oxide was formed on the quartz glass substrate 6, according to the same procedures as described above, except that the above-mentioned targets were replaced by a pair of targets 3, 3' made of a Ti—Nb alloy in which the composition ratio (atom %) of Nb was 10%. This procedure was repeated, to produce three each of the six kinds of samples in which high refractive dielectric films having mutually different compositions made of a mixture of titanium oxide and niobium oxide occur.

The resulting 6-kinds×3 samples were classified into three groups A, B and C. Namely, six kinds of samples having mutually different compositions and having a thickness of a substrate of 1.5 mm was included in the A group, six kinds of other sample shaving mutually different compositions and having a thickness of a substrate of 1.5 mm was included in the B group, and six kinds of samples having mutually different compositions and having a thickness of a substrate of 0.25 mm was included in the C group.

In the same manner as described above, each three of the six kinds of samples in which high refractive dielectric films of a single layer structure having mutually different compositions and having a thickness of 250 nm, made of a mixture of titanium oxide and tantalum oxide were formed on the quartz glass substrate 6, were produced.

The resulting 6-kinds×3 samples were classified into three groups A, B and C just like the samples of high refractive dielectric films made of a mixture of titanium oxide and tantalum oxide.

Figure 5:
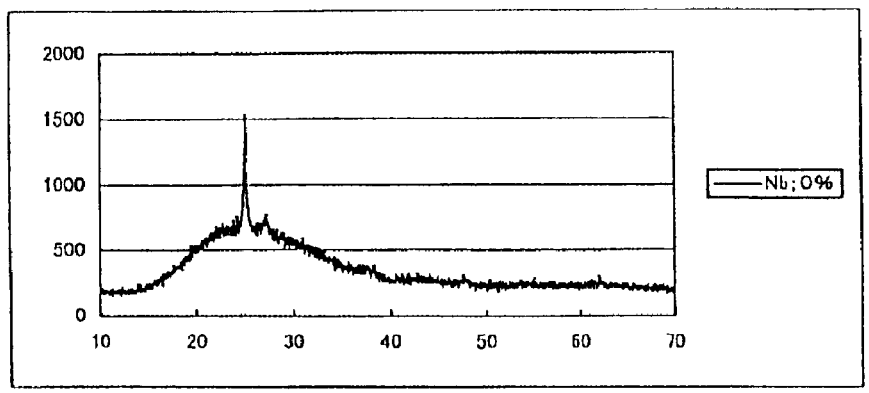
FIG. 5 shows an X-ray diffraction chart of a dielectric film made of a mixture of titanium oxide and niobium oxide.
Figure 5:
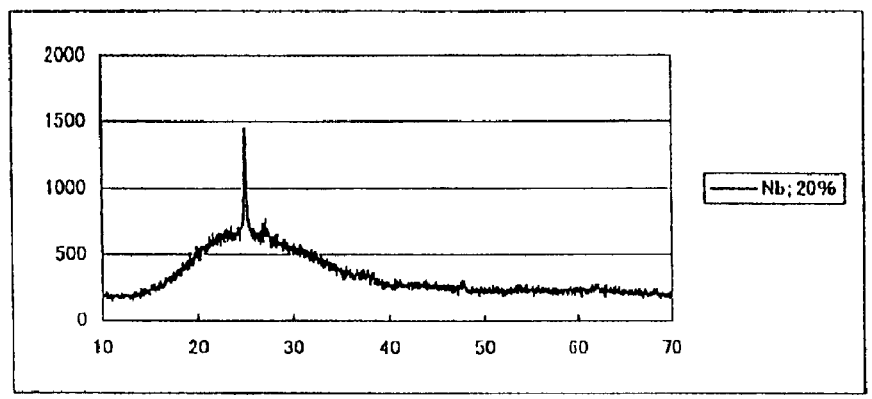
Figure 5:
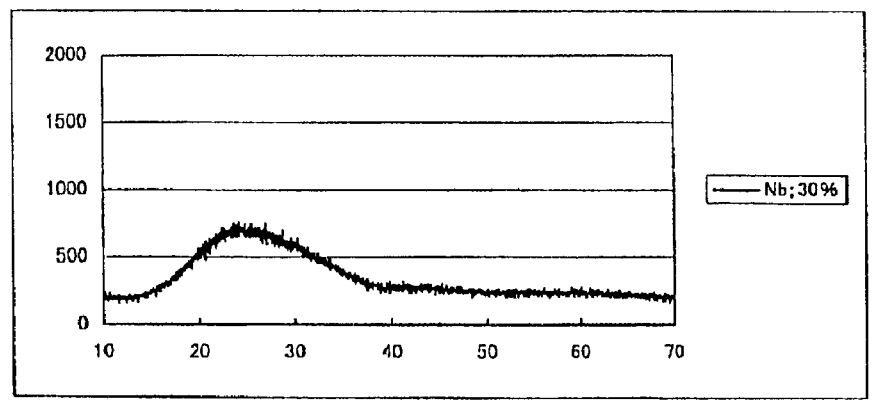
Figure 5:
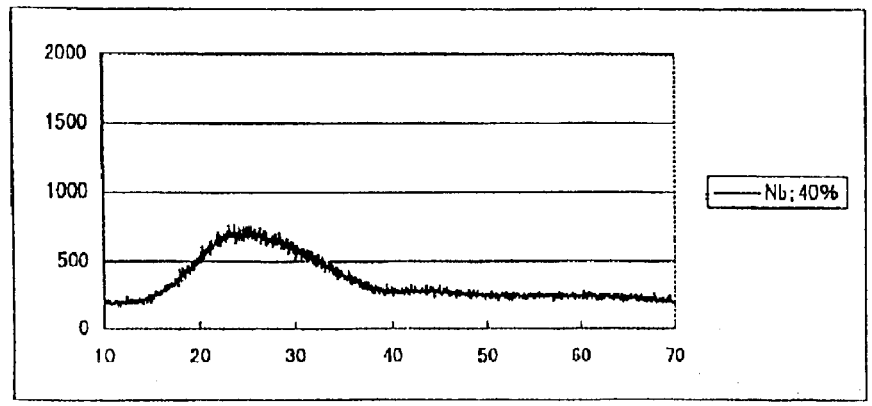
Figure 6:
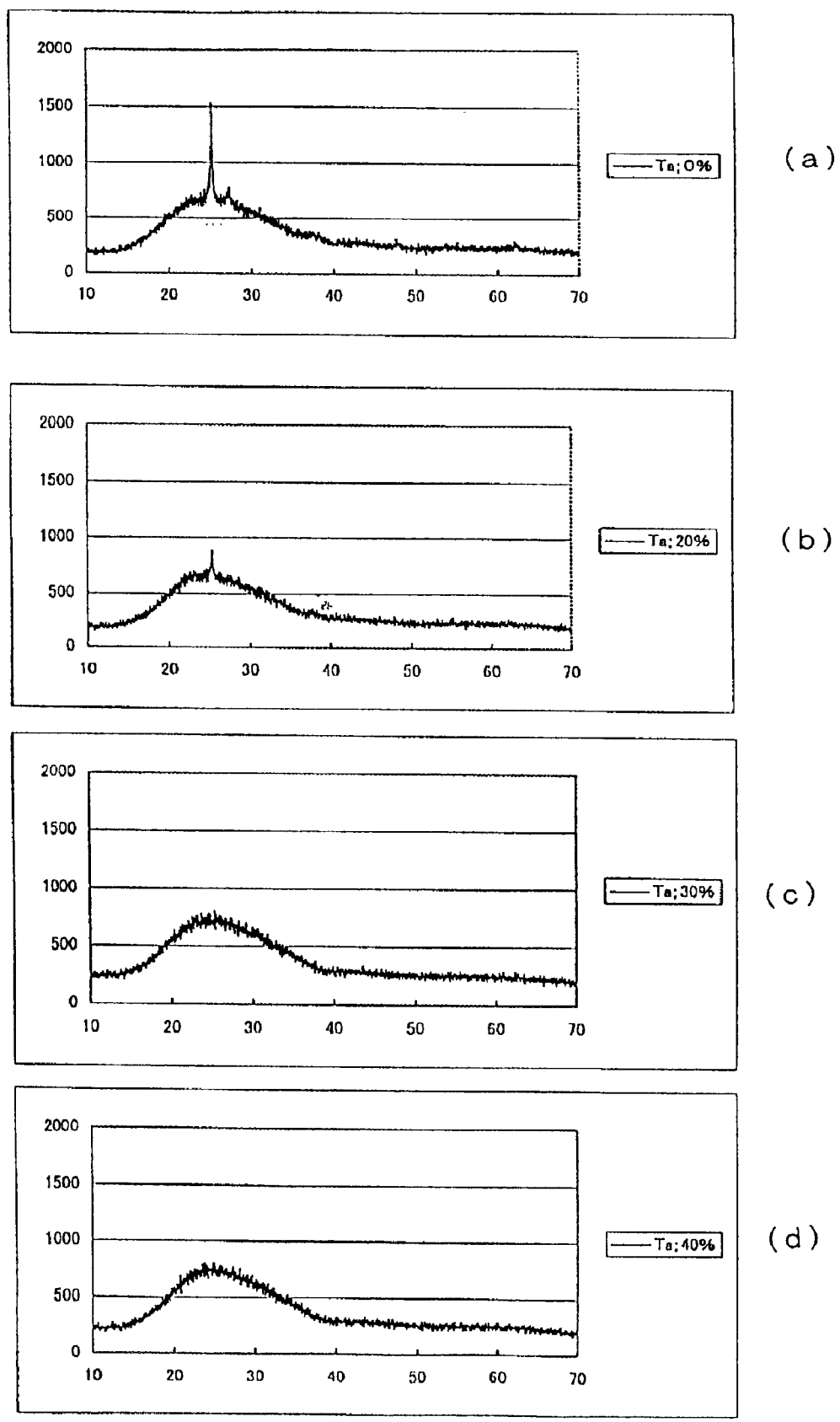
FIG. 6 shows an X-ray diffraction chart of a dielectric film made of a mixture of titanium oxide and tantalum oxide.

FIG. 5 and FIG. 6 show X-ray diffraction charts of dielectric films made of a mixture of titanium oxide and niobium oxide and dielectric films made of a mixture of titanium oxide and tantalum oxide.

As the sample used for measuring X-ray diffraction, the high refractive dielectric film of a single layer structure produced in the above-mentioned procedures was used. Namely, six kinds of samples having mutually different compositions made of a mixture of titanium oxide and niobium oxide and six kinds of samples having mutually different compositions made of a mixture of titanium oxide and tantalum oxide classified in the A group were used.

In FIG. 5 and FIG. 6, diffraction charts when the composition ratio (atom %) of niobium and tantalum was 0%, 20%, 30% and 40% are displayed, of the measured diffraction charts.

When niobium oxide or tantalum oxide is not contained in a dielectric film, a large intensity peak is found at a diffraction angle characterizing the crystal of titanium oxide, however, when the composition ratio of niobium oxide or tantalum oxide increases, the peak derived from titanium oxide lowers slightly, and when the atomic ratio of metallic niobium or metallic tantalum is 30 atom % or more, this peak steeply becomes unrecognizable, and peaks showing the existence of other crystals also disappear. Namely, it is shown that in this region, a dielectric film made of a mixture of titanium oxide and niobium oxide or tantalum oxide changed substantially to an amorphous structure.

The presence or absence of such crystallinity was evaluated by an X-ray diffraction measuring apparatus ("RAD-rC", manufactured by Rigakusha K. K.)

Figure 7:
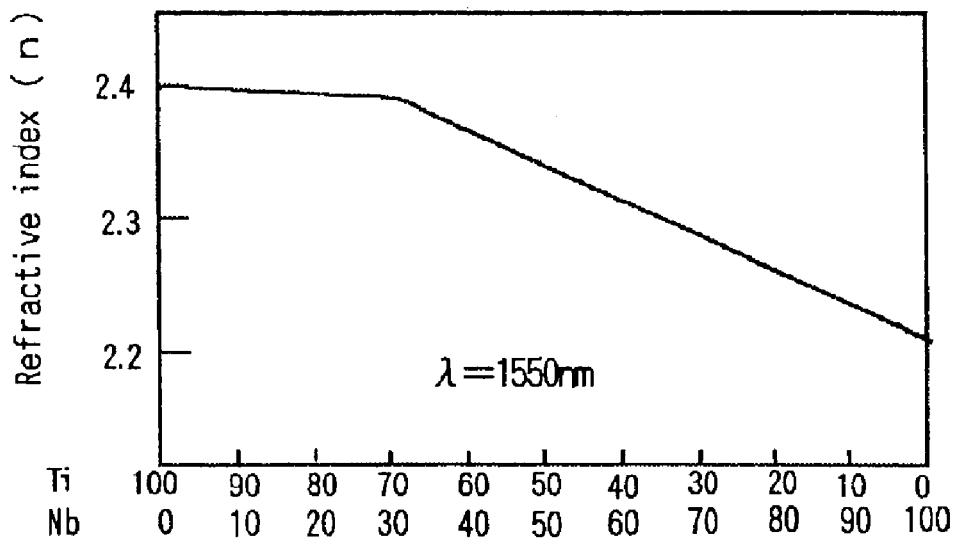
FIG. 7 shows a relation between the refractive index of a dielectric film made of a mixture of titanium oxide and niobium oxide, and the composition ratio of niobium oxide (FIG. 7(a)), and a relation between the refractive index of a dielectric film made of a mixture of titanium oxide and tantalum oxide, and the composition ratio of tantalum oxide (FIG. 7(b)).
Figure 7:
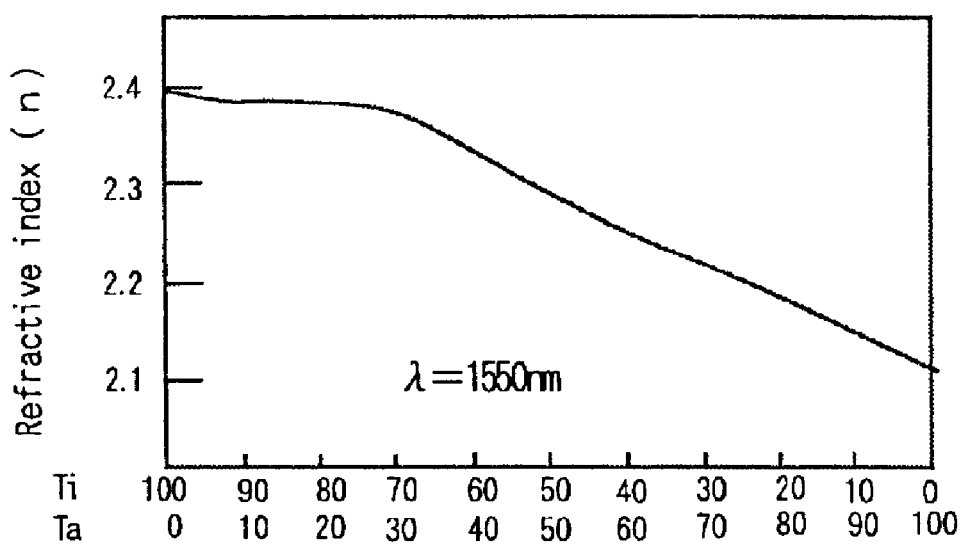

FIG. 7(a) and FIG. 7(b) show a relation between the refractive indices of a dielectric film made of a mixture of titanium oxide and niobium oxide and a dielectric film made of a mixture of titanium oxide and tantalum oxide, and the composition ratio with niobium oxide or tantalum oxide.

As the sample used for measuring the refractive index, the high refractive dielectric film of a single layer structure produced in the above-mentioned procedures was used. Namely, the sample classified in the above-mentioned B group was used.

The abscissa shows the ratio of the other metal oxide added to titanium oxide by the atomic amount ratio of only metal components (M/(Ti+M)). The refractive index is a value measured when a dielectric film made of a mixture of titanium oxide and niobium oxide or tantalum oxide was produced. The measured wavelength for the refractive index was 1550 nm.

When the amount of niobium oxide added to titanium oxide is increased from 0, the refractive index of a mixed dielectric film decreases from about 2.4 which is a refractive index of titanium oxide at a relatively small change rate, until the atomic weight ratio of metallic niobium reaches 30%. When the atomic ratio of metallic niobium is over 30%, the change rate in the refractive index of a mixed dielectric film increases, and the refractive index lowers approximately linearly, finally leading to about 2.2 which is a refractive index of niobium oxide.

Also when tantalum oxide is added to titanium oxide, as in the case of niobium oxide, the refractive index of a mixed dielectric film decreases when the added amount increases, and the decreased ratio changes at an atomic amount ratio of metallic tantalum of about 30%, finally becomes about 2.1 which is a refractive index of tantalum oxide.

These phenomena indicate that even if niobium oxide or tantalum oxide is added to titanium oxide having high crystallinity to render a high refractive dielectric film amorphous, the resulting mixed dielectric film still has a high refractive index so as to provide practical use as an optical multi-layer film, until the atomic amount ratio of metallic niobium or metallic tantalum reaches about 30%.

The composition of a mixed dielectric film was measured by a sequential type plasma emission analysis apparatus "ICPS-8000", manufactured by Shimazu Corp.).

The refractive index of a mixed dielectric film was measured by a spectral ellipso meter (WVASE32, manufactured by J. A. Woollam, Japan).

Figure 8:
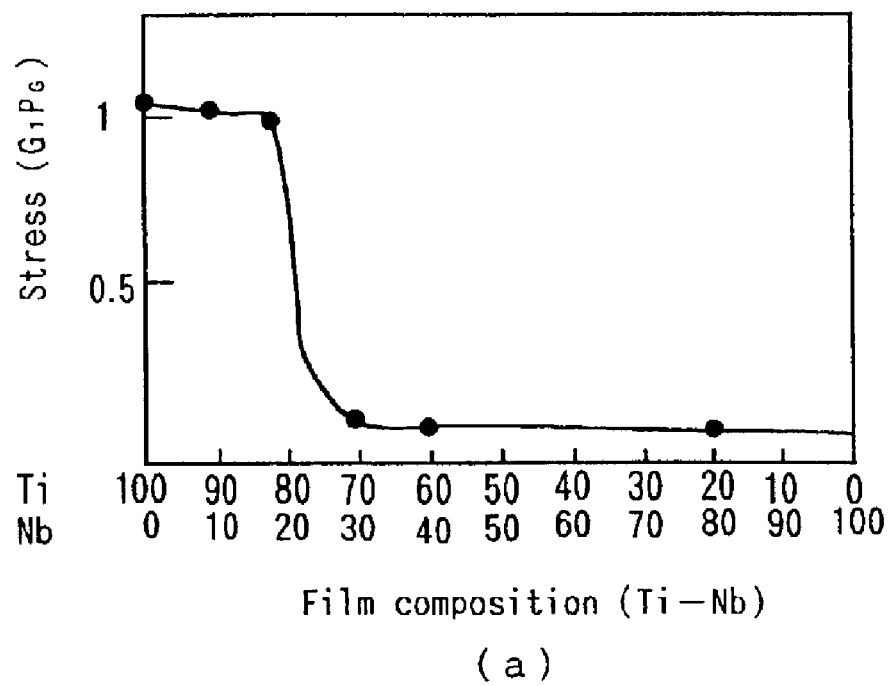
FIG. 8 shows a relation between the film stress of a dielectric film made of a mixture of titanium oxide and niobium oxide, and the composition ratio of niobium oxide (FIG. 8(a)), and a relation between the film stress of a dielectric film made of a mixture of titanium oxide and tantalum oxide, and the composition ratio of tantalum oxide (FIG. 8(b)).
Figure 8:
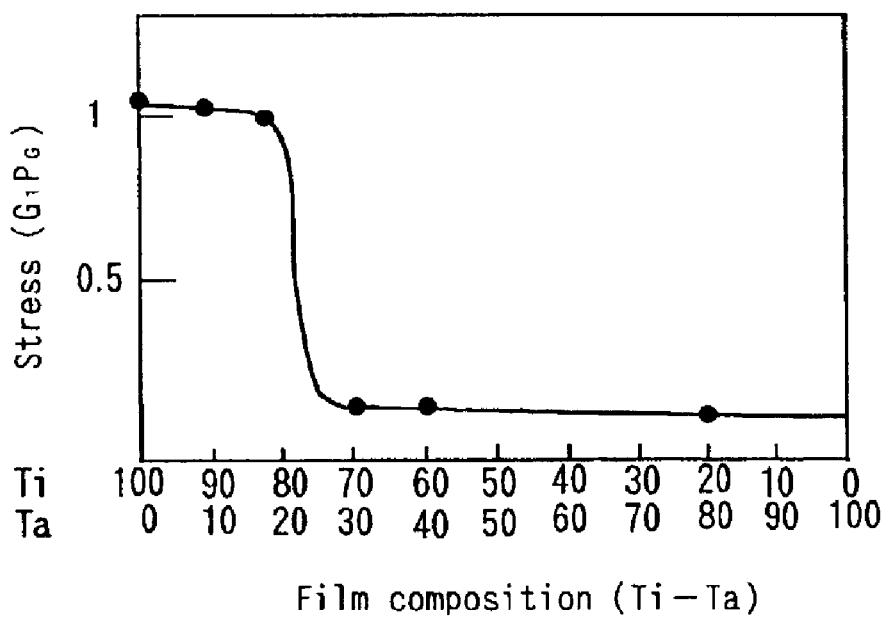

FIG. 8(a) and FIG. 8(b) show a relation between the film stresses of a dielectric film made of a mixture of titanium oxide and niobium oxide and a dielectric film made of a mixture of titanium oxide and tantalum oxide, and the composition ratio with niobium oxide or tantalum oxide.

As the sample used for measuring a refractive index, the high refractive dielectric film of a single layer structure produced in the above-mentioned procedures was used. Namely, the sample having a thickness of a substrate of 0.25 mm classified in the above-mentioned C group was used.

The abscissa shows the ratio of the other metal oxide added to titanium oxide by the atomic amount ratio of only metal components (M/(Ti+M)) in percent figures. The film stress is a value measured when a dielectric film made of a mixture of titanium oxide and the other metal oxide was produced.

The film stress of a thin film made only of titanium oxide is about 1 GPa. When an additional amount of niobium oxide is increased, and the atomic amount ratio of metallic niobium is over 20%, the film stress of the dielectric film decreases steeply, and when the atomic amount ratio of metallic niobium is 30% or more, the film stress decreases to about 1/10 of the film stress of a film made only of titanium oxide.

Also when tantalum oxide is added to titanium oxide, the same tendency as in the case of niobium oxide is shown.

These phenomena show that the addition of niobium oxide and tantalum oxide to titanium oxide brings about the phenomena equivalent to amorphous state of a dielectric film in which two kinds of oxides are mixed.

The film stress was measured by a method in which a dielectric film is formed on a quartz glass substrate and the warping amount generated by film stress is measured by a Newton's ring.

An optical multi-layer film filter using the high refractive dielectric film according to the above-mentioned embodiment of the present invention can be directly formed on the surface of an optical element, consequently, the number of parts can be reduced, fabrication works can be decreased and a necessary space can be made small, therefore, this filter is advantageous for designing an optical communications system.

Since an optical multi-layer film filter is formed by laminating a dielectric film, it is advantageous that the surface of an optical element which is used as a substrate is a flat surface.

As the above-mentioned optical element having a flat surface through which the above-mentioned beam permeates, cylindrical micro lenses and a light guide having the distribution of a refractive index along the radius direction, and the like are exemplified.

Figure 9:
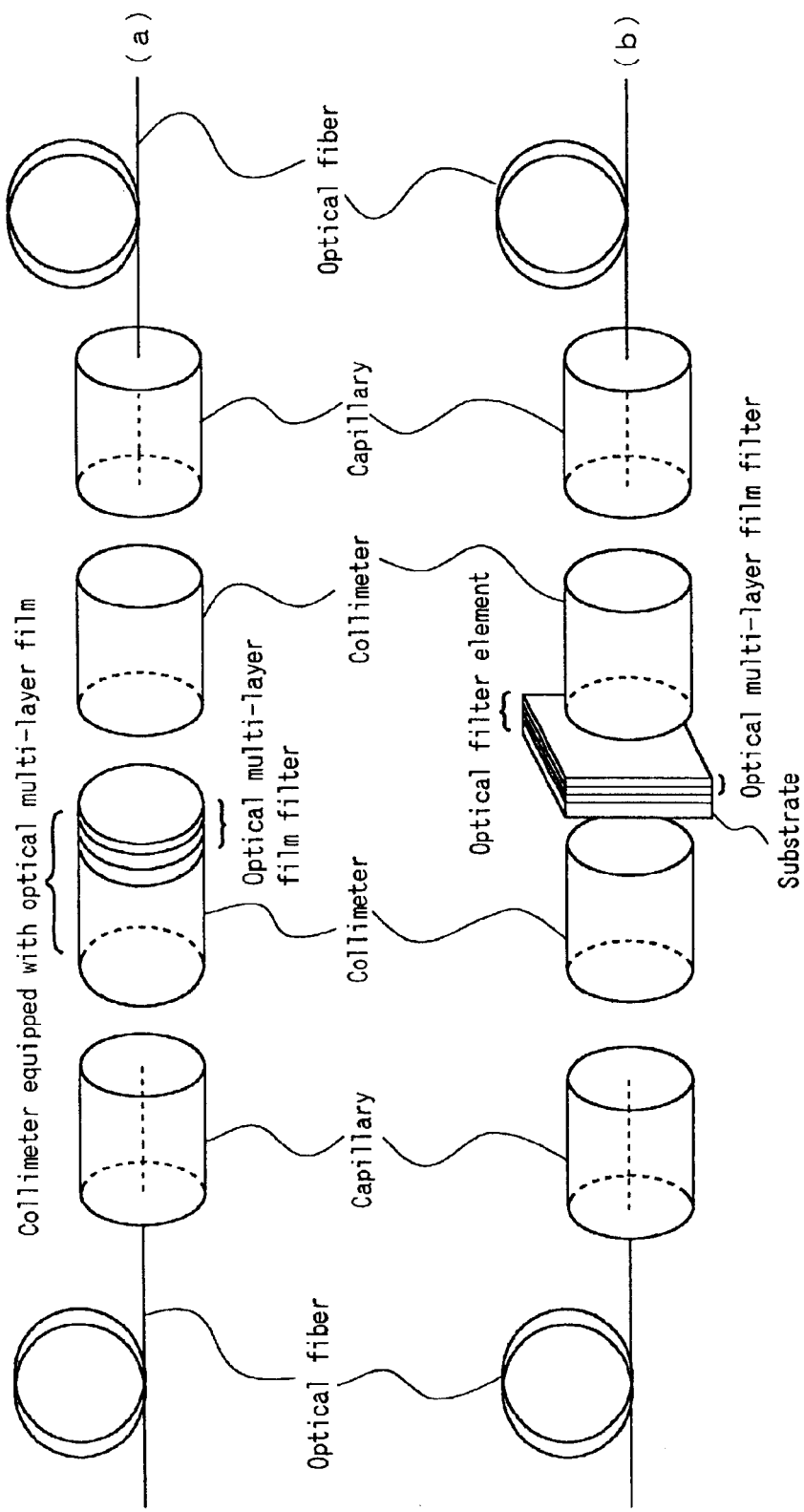
FIG. 9(a) shows an optical system in which a filter of an optical multi-layer film of the present invention is formed on the edge surface of a cylindrical form micro lens (collimator)
FIG. 9(b) shows an optical system in which a collimator and an optical multi-layer film filter element are placed separately, which is a conventional example.

FIG. 9 shows an embodiment in which a cylindrical type micro lens is used as a collimeter, and an optical multi-layer film filter is formed on the edge surface of the collimer through which light permeates. FIG. 9(a) shows an optical system in which an optical multi-layer film filter is formed at the edge surface of a cylindrical type micro lens (collimeter), and FIG. 9(b) shows an optical system, conventional example, in which a collimeter and an optical multi-layer film filter element are placed separately.

If the above-mentioned micro lens is mounted as a substrate, in the above-mentioned reactive neutralization sputtering apparatus, and an optical multi-layer film filter is formed on the edge surface, then, it is possible to produce a large amount of micro lenses with an optical filter at a time.

Industrial Applicability

According to the present invention, a high refractive dielectric film causing no change over time in optical properties and having small film stress can be obtained, therefore, if an optical multi-layer film filter is produced using this material, an optical element manifesting high reliability for a long period of time can be obtained. Such an optical element can perform a particularly large effect when used as a module for optical communications of wavelength multiple mode.

What is claimed is:

1. A high refractive dielectric film constructing a dielectric multi-layer film in which a high refractive dielectric film having a relatively high refractive index and a low refractive dielectric film having a relatively low refractive index are alternately laminated on a transparent substrate, wherein the high refractive dielectric film is made of an amorphous material having no columnar structure, obtained by adding to titanium oxide (TiOx: 1<x<2) another metal oxide (MOy: 1≦y≦5/2) selected from the group consisting of niobium oxide (NbOy), and tantalum oxide (TaOy) and the ratio of the other metal component to the total amount of metal components (M/(Ti+M)) is 30 atom % or more and the low refractive dielectric film is made of an amorphous material having no columnar structure, obtained by adding to silica.

2. A high refractive dielectric film constructing a dielectric multi-layer film prepared by the method in the chamber in which a pair of cathodes for magnetron sputtering, a pair of targets placed on the pair of cathodes and a substrate, which is a film forming object, placed at a location opposite to said pair of targets are prepared in a vacuum chamber capable of producing a reduced atmosphere, and a film is formed on the surface of said substrate by a reactive neutralization sputtering method using oxygen as a reactive gas while applying alternating voltage so as to change the polarities of said pair of cathodes alternately, wherein two steps of a step in which a first pair of cathodes made of an alloy of titanium (Ti) and another metal (M) or a mixture of titanium (Ti) and said another metal (M) selected from niobium (Nb) and tantalum (Ta) are placed at mutually adjacent positions in parallel, and alternating voltage is applied to said pair of cathodes using as a process gas an oxygen-containing gas of a first given concentration, to form on the surface of the substrate a relatively high refractive dielectric film which is an amorphous material having no columnar crystal, made of titanium oxide (TiOx: 1≦x≦2) and another metal oxide (MOy: 1≦y≦5/2) selected from niobium oxide (NbOy) and tantalum oxide (TaOy) and a step in which a second pair of targets made of silicon (Si) metal are placed at mutually adjacent positions in parallel, apart from said first pair of targets, the substrate surface on which said high refractive dielectric film is formed is shifted to a location opposite to said second pair of targets and alternating voltage is applied using as a process gas an oxygen-containing gas of a second given concentration, to form a relatively low refractive dielectric film on the substrate surface carrying thereon said high refractive dielectric film formed are repeated a given number of times in the order as described above or in the reverse order, to form on the surface of the substrate an optical multi-layer film.

3. A high refractive dielectric film constructing a dielectric multi-layer film according to claim 2 wherein said high refractive dielectric film has a film stress of 0.30 GPa or less.

4. The high refractive dielectric film according to claim 1 wherein said high refractive dielectric film has a film stress of 0.30 Gpa or less.

5. A high refractive dielectric film constructing a dielectric multi-layer film prepared in the chamber by a method in which a pair of cathodes for magnetron sputtering, a pair of targets placed on the pair of cathodes and a substrate, which is a film forming object placed at a location opposite to said pair of targets, are prepared in a vacuum chamber capable of producing a reduced atmosphere, and a film is formed on the surface of said substrate by a reactive neutralization sputtering method using oxygen as a reactive gas while applying alternating voltage so as to change the polarities of said pair of cathodes alternately, wherein the method comprises repeating the following two steps a given number of times in the order as set forth or in the reverse order, to form on the surface of the substrate an optical multi-layer film:

a first step in which a first pair of cathodes made of an alloy of titanium (Ti) and another metal (M) or a mixture of titanium (Ti) and said another metal (M) selected from niobium (Nb) and tantalum (Ta) are placed at mutually adjacent positions in parallel, and alternating voltage is applied to said pair of cathodes using as a process gas an oxygen-containing gas of a first given concentration, to form on the surface of the substrate a relatively high refractive dielectric film which is an amorphous material having no columnar crystal, made of titanium oxide (TiOx: 1≦x≦2) and another metal oxide (MOy: 1≦y≦5/2) selected from niobium oxide (NbOy) and tantalum oxide (TaOy); and a second step in which a second pair of targets made of silicon (Si) metal are placed at mutually adjacent positions in parallel, apart from said first pair of targets, the substrate surface on which said high refractive dielectric film is formed is shifted to a location opposite to said second pair of targets and alternating voltage is applied using as a process gas an oxygen-containing gas of a second given concentration, to form a relatively low refractive dielectric film on the substrate surface carrying thereon said high refractive dielectric film formed.

6. The high refractive dielectric film according to claim 5 wherein said high refractive dielectric film has a film stress of 0.30 GPa or less.

* * * * *